(12) United States Patent
Whitcomb

(10) Patent No.: US 9,017,450 B2
(45) Date of Patent: Apr. 28, 2015

(54) NANOWIRE PREPARATION METHODS, COMPOSITIONS, AND ARTICLES

(75) Inventor: David R. Whitcomb, Woodbury, MN (US)

(73) Assignee: Carestream Health, Inc., Rochester, NY (US)

( * ) Notice: Subject to any disclaimer, the term of this patent is extended or adjusted under 35 U.S.C. 154(b) by 315 days.

(21) Appl. No.: 13/291,308

(22) Filed: Nov. 8, 2011

(65) Prior Publication Data

US 2012/0148844 A1 Jun. 14, 2012

Related U.S. Application Data

(60) Provisional application No. 61/421,302, filed on Dec. 9, 2010.

(51) Int. Cl.
| | |
|---|---|
| *B22F 9/24* | (2006.01) |
| *B82B 3/00* | (2006.01) |
| *C22C 5/06* | (2006.01) |
| *B22F 1/00* | (2006.01) |
| *B82Y 30/00* | (2011.01) |
| *B82Y 40/00* | (2011.01) |
| *C22C 1/04* | (2006.01) |
| *C30B 29/02* | (2006.01) |
| *C30B 29/60* | (2006.01) |

(52) U.S. Cl.
CPC ......... *B22F 1/0025* (2013.01); *Y10T 428/2913* (2015.01); *Y10T 428/298* (2015.01); *B22F 9/24* (2013.01); *B22F 2998/00* (2013.01); *B22F 2999/00* (2013.01); *B82Y 30/00* (2013.01); *B82Y 40/00* (2013.01); *C22C 1/0466* (2013.01); *C30B 29/02* (2013.01); *C30B 29/60* (2013.01)

(58) Field of Classification Search
USPC .......................................... 75/371
See application file for complete search history.

(56) References Cited

U.S. PATENT DOCUMENTS

| | | | |
|---|---|---|---|
| 6,159,267 | A | 12/2000 | Mampden-Smith et al. |
| 7,749,299 | B2 * | 7/2010 | Vanheusden et al. ........... 75/362 |
| 2008/0003130 | A1 | 1/2008 | Xia et al. |
| 2009/0074649 | A1 * | 3/2009 | Korgel et al. ................. 423/349 |
| 2009/0226753 | A1 | 9/2009 | Naoi |
| 2010/0139455 | A1 * | 6/2010 | Tilley et al. .................... 75/351 |
| 2010/0247870 | A1 | 9/2010 | Suzuki et al. |

FOREIGN PATENT DOCUMENTS

| | | |
|---|---|---|
| CN | 101934377 | 1/2011 |
| CN | 102029400 | 4/2011 |
| JP | 2009-155674 | 7/2009 |

(Continued)

OTHER PUBLICATIONS

Sun et al. Crystalline silver nanowires by soft solution processing, Nano Letters, 2002, vol. 2, p. 165-168.*

(Continued)

*Primary Examiner* — Jie Yang
*Assistant Examiner* — Xiaowei Su
(74) *Attorney, Agent, or Firm* — Reed L. Christiansen

(57) ABSTRACT

Nanomaterial preparation methods, compositions, and articles are disclosed and claimed. Such methods can provide nanomaterials with improved morphologies relative to previous methods. Such materials are useful in electronic applications.

9 Claims, 7 Drawing Sheets

(56) References Cited

FOREIGN PATENT DOCUMENTS

| WO | WO2007/032144 | | 3/2007 |
|---|---|---|---|
| WO | WO 2008030110 A2 | * | 3/2008 |

OTHER PUBLICATIONS

Purgato et al., Activity of platinum—tin catalysts prepared by the Pechini-Adams method for electrooxidation of ethanol, Journal of Electroanalytical Chemistry, vol. 628, 2009, pp. 81-89.

Kostowskyj et al., Silver nanowire catalysts for alkaline fuel cells, International Journal of Hydrogen Energy, Vo. 33, 2008, pp. 5773-5778.

International Search Report, International application No. PCT/US2011/059846, dated Dec. 5, 2012, 2 pages.

Younan Xia, et al., "Shape-Controlled Synthesis of Metal Nanocrystals: Simple Chemistry Meets Complex Physics?", Angew. Chem. Int. Ed. 2009, 48, pp. 60-103.

Jinting Jiu, et al., "Preparation of Ag nanorods with high yield by polyol process," Mat. Chem. & Phys., 2009, 114, pp. 333-338.

Srichandana Nandikonda, "Microwave Assisted Synthesis of Silver Nanorods," M.S. Thesis, Auburn University, Aug. 9, 2010, 59 pages.

Srichandana Nandikonda, et al., "Effects of salt selection on the rapid synthesis of silver nanowires," Abstract INOR-200, 240th ACS National Meeting, Boston, MA, Aug. 23, 2010, 1 page.

D.W. Slocum, "Organometallic compound," McGraw-Hill Encyclopedia of Chemistry, 2d ed., S.P. Parker, ed., 1993, pp. 755-760.

Y.C. Lu, et al., "Tailoring of silver wires and their performance as transparent conductive coatings," Nanotechnology, 2010, 21, 215707, 6 pages.

* cited by examiner

NANOWIRE PREPARATION METHODS, COMPOSITIONS, AND ARTICLES

CROSS REFERENCE TO RELATED APPLICATIONS

This application claims the benefit of U.S. Provisional Application No. 61/421,302, filed Dec. 9, 2010, entitled ORGANOMETALLIC COMPOUNDS AS CATALYSTS OF METAL ION REDUCTION, METHODS, COMPOSITIONS, AND ARTICLES, which is hereby incorporated by reference in its entirety.

BACKGROUND

The general preparation of silver nanowires (10-200 aspect ratio) is known. See, for example, Angew. Chem. Int. Ed. 2009, 48, 60, Y. Xia, Y. Xiong, B. Lim, S. E. Skrabalak, which is hereby incorporated by reference in its entirety. Such preparations typically employ $Fe^{2+}$ or $Cu^{2+}$ ions to "catalyze" the wire formation over other morphologies. The controlled preparation of silver nanowires having the desired lengths and widths, however, is not known. For example, the $Fe^{2+}$ produces a wide variety of lengths or thicknesses and the $Cu^{2+}$ produces wires that are too thick for many applications.

The metal ions used to catalyze wire formation are generally primarily reported to be provided as a metal halide salt, usually as a metal chloride, for example, $FeCl_2$ or $CuCl_2$. See, for example, J. Jiu, K. Murai, D. Kim, K. Kim, K. Suganuma, Mat. Chem. & Phys., 2009, 114, 333, which refers to NaCl, $CoCl_2$, $CuCl_2$, $NiCl_2$ and $ZnCl_2$; Japanese patent application publication JP2009155674, which describes $SnCl_4$; S. Nandikonda, "Microwave Assisted Synthesis of Silver Nanorods," M.S. Thesis, Auburn University, Aug. 9, 2010, which refers to NaCl, KCl, $MgCl_2$, $CaCl_2$, $MnCl_2$, $CuCl_2$, and $FeCl_3$; S. Nandikonda and E. W. Davis, "Effects of Salt Selection on the Rapid Synthesis of Silver Nanowires," Abstract INOR-299, 240th ACS National Meeting, Boston, Mass., Aug. 22-27, 2010, which discloses NaCl, KCl, $MgCl_2$, $CaCl_2$, $MnCl_2$, $CuCl_2$, $FeCl_3$, $Na_2S$, and NaI; Chinese patent application publication CN101934377, which discloses $Mn^{2+}$; Y. C. Lu, K. S. Chou, Nanotech., 2010, 21, 215707, which discloses $Pd^{2+}$; and Chinese patent application publication CN102029400, which discloses NaCl, $MnCl_2$, and $Na_2S$.

SUMMARY

At least some embodiments provide methods comprising: providing a composition comprising at least one first reducible metal ion and at least one compound comprising at least one second metal and at least one carbon atom covalently bonded to the at least one second metal, the at least one second metal differing in atomic number from the at least one first reducible metal; and reducing the at least one first reducible metal ion to at least one first metal.

In at least some embodiments, the at least one first reducible metal ion may comprise one or more of at least one coinage metal ion, at least one ion of an element from IUPAC Group 11, or at least one silver ion.

In some cases, the at least one second metal comprises at least one element from IUPAC Groups 3, 4, 5, 6, 7, 8, 9, 10, 11, 12, 13, or 14 or at least one element from IUPAC Groups 4 or 14. Such at least one second metal may, for example, comprise titanium or tin.

In at least some embodiments, the at least one compound may comprise at least one aromatic moiety, such as, for example, at least one cyclopentadienyl moiety or phenyl moiety. Exemplary compounds are titanocene dichloride and phenyltintrichloride.

Other embodiments provide the at least one first metal produced according to such methods.

Still other embodiments provide metal nanowires comprising the at least one first metal produced according to such methods. In some cases, the metal nanowires may comprise an aspect ratio between about 50 and about 10,000. Such nanowires may, for example, comprise an average diameter of between about 10 nm and about 300 nm. An exemplary metal nanowire is a silver nanowire.

Yet still other embodiments provide articles comprising the at least one first metal produced according to such methods. Such articles may, for example, comprise at least one of an electronic display, a touch screen, a portable telephone, a cellular telephone, a computer display, a laptop computer, a tablet computer, a point-of-purchase kiosk, a music player, a television, an electronic game, an electronic book reader, a transparent electrode, a solar cell, a light emitting diode, an electronic device, a medical imaging device, or a medical imaging medium.

These embodiments and other variations and modifications may be better understood from the brief description of figures, description, exemplary embodiments, examples, figures, and claims that follow. Any embodiments provided are given only by way of illustrative example. Other desirable objectives and advantages inherently achieved may occur or become apparent to those skilled in the art. The invention is defined by the appended claims.

DESCRIPTION

Figure 1:
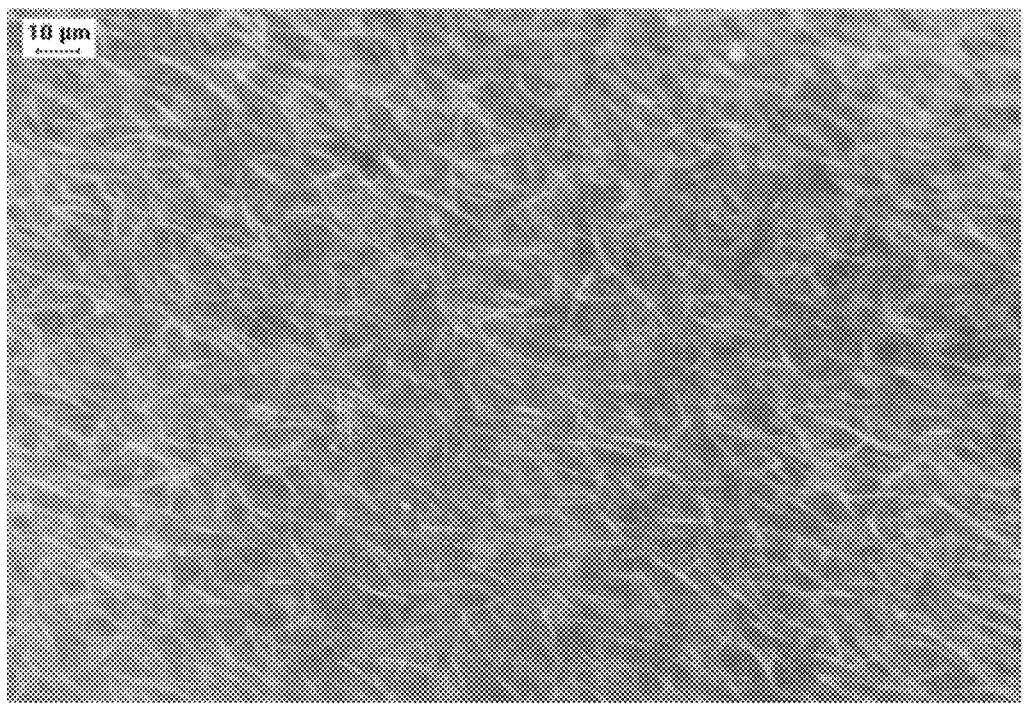
FIG. 1 shows an optical micrograph of the silver nanowire product of Example 1.

All publications, patents, and patent documents referred to in this document are incorporated by reference herein in their entirety, as though individually incorporated by reference.

U.S. Provisional Application No. 61/421,302, filed Dec. 9, 2010, entitled ORGANOMETALLIC COMPOUNDS AS CATALYSTS OF METAL ION REDUCTION, METHODS, COMPOSITIONS, AND ARTICLES, is hereby incorporated by reference in its entirety.

The applicant has recognized that organometallic compounds, such as, for example, dicyclopentadienyltitaniumchloride (also known as titanocene dichloride) and phenyltintrichloride, may be used to prepare metal nanowires, such as, for example silver nanowires in high yield compared to non-wire morphologies, with desirable control of nanowire thickness, or length, or both.

Reducible Metal Ions and Metal Products

Some embodiments provide methods comprising reducing at least one reducible metal ion to at least one metal. A reducible metal ion is a cation that is capable of being reduced to a metal under some set of reaction conditions. In such methods, the at least one first reducible metal ion may, for example, comprise at least one coinage metal ion. A coinage metal ion is an ion of one of the coinage metals, which include copper, silver, and gold. Or such a reducible metal ion may, for example, comprise at least one ion of an IUPAC Group 11 element. An exemplary reducible metal ion is a silver cation. Such reducible metal ions may, in some cases, be provided as salts. For example, silver cations might, for example, be provided as silver nitrate.

In such embodiments, the at least one metal is that metal to which the at least one reducible metal ion is capable of being reduced. For example, silver would be the metal to which a silver cation would be capable of being reduced.

These methods are also believed to be applicable to reducible metal cations other than silver cations, including, for example reducible cations of other IUPAC Group 11 elements, reducible cations of other coinage metals, and the like. These methods may also be used to prepare products other than nanowires, such as, for example, nanocubes, nanorods, nanopyramids, nanotubes, and the like. Such products may be incorporated into articles, such as, for example, transparent electrodes, solar cells, light emitting diodes, other electronic devices, medical imaging devices, medical imaging media, and the like.

Organometallic Compounds

Organometallic compounds comprise at least one metal atom that is covalently bonded to at least one carbon atom. Such covalent bonds may be distinguished from coordinate covalent bonds involving lone pair electrons. The metal may optionally also be bonded to an element other than carbon, such as, for example, chlorine. Organometallic compounds may, for example, comprise chelates, metal alkoxides, salts of carboxylic or sulfonic acids, and the like. In some embodiments, organometallic compounds may comprise one or more metal atoms from one or more of IUPAC Groups 3-10. Organometallic compounds are described in more detail in such references as D. W. Slocum, "Organometallic Compound," *McGraw-Hill Encyclopedia of Chemistry, 2d ed.*, S. P. Parker., ed., 1993, 755-760, which is hereby incorporated by reference in its entirety.

The organometallic compounds of the present application may, for example, comprise at least one element from IUPAC Groups 3, 4, 5, 6, 7, 8, 9, 10, 11, 12, 13, or 14, or at least one element from IUPAC Groups 4 or 14. Such organometallic compounds may, for example, comprise titanium or tin. Such organometallic compounds may, in at least some embodiments, comprise at least one aromatic moiety, such as, for example, a cyclopentadienyl moiety or a phenyl moiety. Exemplary organometallic compounds are titanocene dichloride and phenyltintrichloride.

Nanostructures, Nanostructures, Nanowires, and Articles

In some embodiments, the metal product formed by such methods is a nanostructure, such as, for example, a one-dimensional nanostructure. Nanostructures are structures having at least one "nanoscale" dimension less than 300 nm. Examples of such nanostructures are nanorods, nanowires, nanotubes, nanopyramids, nanoprisms, nanoplates, and the like. "One-dimensional" nanostructures have one dimension that is much larger than the other two nanoscale dimensions, such as, for example, at least about 10 or at least about 100 or at least about 200 or at least about 1000 times larger.

Such one-dimensional nanostructures may, in some cases, comprise nanowires. Nanowires are one-dimensional nanostructures in which the two short dimensions (the thickness dimensions) are less than 300 nm, preferably less than 100 nm, while the third dimension (the length dimension) is greater than 1 micron, preferably greater than 10 microns, and the aspect ratio (ratio of the length dimension to the larger of the two thickness dimensions) is greater than five. Nanowires are being employed as conductors in electronic devices or as elements in optical devices, among other possible uses. Silver nanowires are preferred in some such applications.

The compositions and methods of the present application allow tailoring of nanowire diameters. In some cases, nanowires may be thin or thick. Thin nanowires can be useful in applications where transparency is important, while thick nanowires can be useful in applications requiring high current densities. Such nanowires may, for example, comprise an average diameter of between about 10 nm and about 300 nm, or of between about 25 nm and about 260 nm.

Such methods may be used to prepare nanostructures other than nanowires, such as, for example, nanocubes, nanorods, nanopyramids, nanotubes, and the like. Nanowires and other nanostructure products may be incorporated into articles, such as, for example, electronic displays, touch screens, portable telephones, cellular telephones, computer displays, laptop computers, tablet computers, point-of-purchase kiosks, music players, televisions, electronic games, electronic book readers, transparent electrodes, solar cells, light emitting diodes, other electronic devices, medical imaging devices, medical imaging media, and the like.

Preparation Methods

A common method of preparing nanostructures, such as, for example, nanowires, is the "polyol" process. Such a process is described in, for example, *Angew. Chem. Int. Ed.* 2009, 48, 60, Y. Xia, Y. Xiong, B. Lim, S. E. Skrabalak, which is hereby incorporated by reference in its entirety. Such processes typically reduce a metal cation, such as, for example, a silver cation, to the desired metal nanostructure product, such as, for example, a silver nanowire. Such a reduction may be carried out in a reaction mixture that may, for example, comprise one or more polyols, such as, for example, ethylene glycol (EG), propylene glycol, butanediol, glycerol, sugars, carbohydrates, and the like; one or more protecting agents, such as, for example, polyvinylpyrrolidinone (also known as polyvinylpyrrolidone or PVP), other polar polymers or copolymers, surfactants, acids, and the like; and one or more metal ions. These and other components may be used in such reaction mixtures, as is known in the art. The reduction may, for example, be carried out at one or more temperatures from about 120° C. to about 190° C., or from about 80° C. to about 190° C.

EXEMPLARY EMBODIMENTS

U.S. Provisional Application No. 61/421,302, filed Dec. 9, 2010, entitled ORGANOMETALLIC COMPOUNDS AS CATALYSTS OF METAL ION REDUCTION, METHODS, COMPOSITIONS, AND ARTICLES, which is hereby incorporated by reference in its entirety, disclosed the following 30 non-limiting exemplary embodiments:

A. A method comprising:
   providing a composition including:
      at least one first compound comprising at least one first reducible metal ion,
      at least one second compound comprising at least one second metal and at least one carbon atom covalently bonded to the at least one second metal, said at least one second metal differing in atomic number from said at least one first reducible metal ion, and at least one solvent; and reducing the at least one first reducible metal ion to at least one first metal.

B. The method of embodiment A, wherein the composition further comprises at least one protecting agent.

C. The method of embodiment B, wherein the at least one protecting agent comprises at least one of: one or more surfactants, one or more acids, or one or more polar polymers.

D. The method of embodiment B, wherein the at least one protecting agent comprises polyvinylpyrrolidinone.

E. The method of embodiment B, further comprising inerting the at least one protecting agent.

F. The method of embodiment A, wherein the at least one first reducible metal ion comprises at least one coinage metal ion.

G. The method of embodiment A, wherein the at least one first reducible metal ion comprises at least one ion of an element from IUPAC Group 11.

H. The method of embodiment A, wherein the at least one first reducible metal ion comprises at least one ion of silver.

J. The method of embodiment A, wherein the at least one first compound comprises silver nitrate.

K. The method of embodiment A, wherein the at least one second metal comprises at least one element in IUPAC Groups 3-10.

L. The method of embodiment A, wherein the at least one second metal comprises at least one element in IUPAC Group 4.

M. The method of embodiment A, wherein the at least one second metal comprises titanium.

N. The method of embodiment A, wherein the at least one second compound comprises at least one aromatic moiety.

P. The method of embodiment A, wherein the at least one second compound comprises at least one cyclopentadienyl moiety.

Q. The method of embodiment A, wherein the at least one second compound comprises at least one titanium atom and at least one cyclopentadienyl moiety.

R. The method of embodiment A, wherein the at least one solvent comprises at least one polyol.

S. The method of embodiment A, wherein the at least one solvent comprises at least one of: ethylene glycol, propylene glycol, glycerol, one or more sugars, or one or more carbohydrates.

T. The method of embodiment A, wherein the composition has a ratio of the total moles of the at least one second metal to the moles of the at least one first reducible metal ion from about 0.0001 to about 0.1.

U. The method of embodiment A, wherein the reduction is carried out at one or more temperatures from about 120° C. to about 190° C.

V. The method of embodiment A, further comprising inerting one or more of: the composition, the at least one first compound, the at least one second compound, or the at least one solvent.

W. The at least one first metal produced according to the method of embodiment A.

X. At least one article comprising the at least one first metal produced according to the method of embodiment A.

Y. The at least one article of embodiment X, wherein the at least one first metal comprises one or more nanowires, nanocubes, nanorods, nanopyramids, or nanotubes.

Z. The at least one article of embodiment X, wherein the at least one first metal comprises at least one object having an average diameter of between about 10 nm and about 500 nm.

AA. The at least one article of embodiment X, wherein the at least one first metal comprises at least one object having an aspect ratio from about 50 to about 10,000.

AB At least one metal nanowire with an average diameter of between about 10 nm and about 150 nm, and with an aspect ratio from about 50 to about 10,000.

AC. The nanowire of embodiment AB, wherein the at least one metal comprises at least one coinage metal.

AD. The nanowire of embodiment AB, wherein the at least one metal comprises at least one element of IUPAC Group 11.

AE. The nanowire of embodiment AB, wherein the at least one metal comprises silver.

AF. At least one article comprising the at least one metal nanowire of embodiment AB.

EXAMPLES

Example 1

To a 500 mL reaction flask was added 280 mL ethylene glycol (EG). This liquid was stripped of at least some dissolved gases by bubbling $N_2$ into the solution for at least 2 hrs using a glass pipette at room temperature with mechanical stirring while at 100 rpm. (This operation will be referred to as "degassing" the solution in the sequel.) Stock solutions of 0.28 M $AgNO_3$ in EG and 0.84 M (based on moles of repeat units) polyvinylpyrrolidinone (PVP, 55,000 molecular weight) in EG were also degassed by bubbling $N_2$ into the solutions for 60 minutes. Two syringes were loaded with 20 mL each of the $AgNO_3$ and PVP solutions. To the reaction flask was added 3.6 g of a solution having a concentration of 1.67 mg titanocene dichloride per gram of EG. The reaction mixture was heated to 145° C. under $N_2$ and the $AgNO_3$ and PVP solutions were added at a constant rate over 25 minutes via 12 gauge TEFLON® fluoropolymer syringe needles. The reaction mixture was held at 145° C. for 90 minutes then allowed to cool to room temperature. From the cooled mixture, the reaction mixture was diluted by an equal volume of acetone, and centrifuged at 500 G for 45 minutes. The supernatant was decanted, while the remaining solid was re-dispersed in 200 mL isopropanol by shaking for 10 minutes and centrifuged again, decanted and diluted with 15 mL isopropanol.

FIG. 1 shows an optical micrograph of the silver nanowire product. The figure shows very low concentration of non-nanowire solids.

Example 2

To a 500 mL reaction flask was added 300 mL ethylene glycol (EG), 3.4 g of PVP, and 12.6 mg of titanocene dichloride. This solution was degassed overnight by bubbling $N_2$ into the solution using a TEFLON® fluoropolymer tube at room temperature with mechanical stirring while at 100 rpm. A stock solutions of 0.50 M $AgNO_3$ in EG was also degassed by bubbling $N_2$ into the solution for at least 60 minutes. A syringe was loaded with 20 mL of the $AgNO_3$ solution. The reaction mixture was heated to 145° C. under $N_2$ and the $AgNO_3$ solution was added at a constant rate over 25 minutes via a 12 gauge TEFLON® fluoropolymer syringe needle. The reaction was held at 145° C. for 60 minutes then allowed to cool to room temperature.

Figure 2:
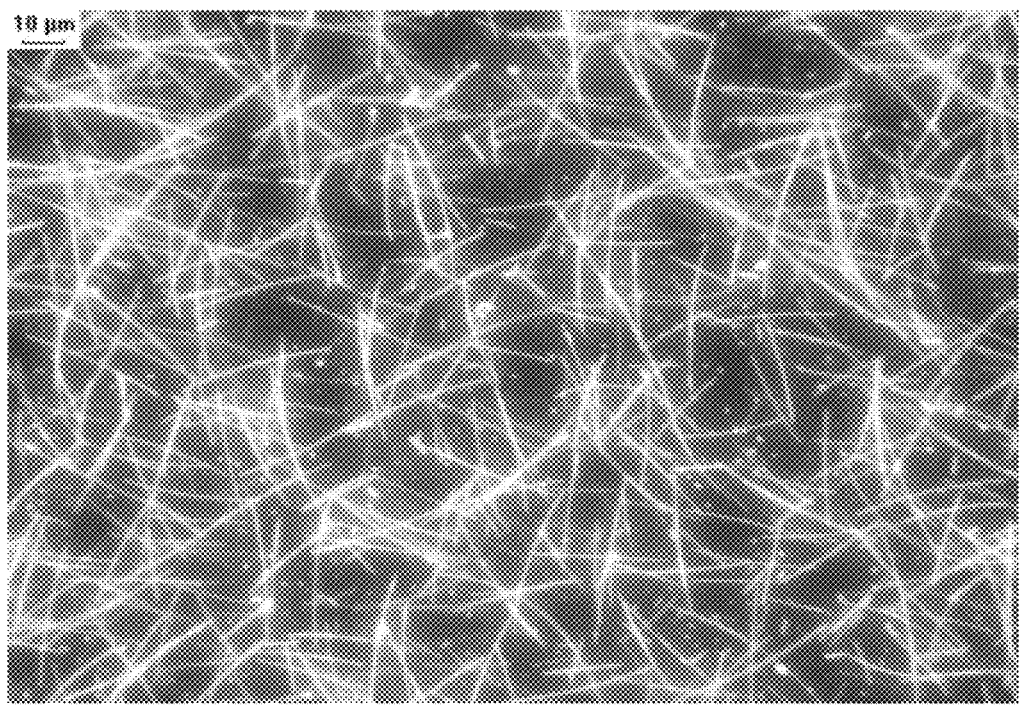
FIG. 2 shows an optical micrograph of the silver nanowire product of Example 2.

FIG. 2 shows an optical micrograph of the silver nanowire product. The nanowires had an average diameter of 115±52 nm and an average length of 14.5±10.7 μm, based on measurements of at least 100 wires.

Example 3

To a 500 mL reaction flask was added 300 mL propylene glycol (PG, Aldrich), 1.9 g of PVP, and 32.8 mg of titanocene dichloride. This solution was degassed overnight by bubbling $N_2$ into the solution using a TEFLON® fluoropolymer tube at room temperature with mechanical stirring while at 100 rpm. A stock solution of 0.50 M $AgNO_3$ in PG was also degassed by bubbling $N_2$ into the solution for at least 60 minutes. A syringe was loaded with 20 mL of the $AgNO_3$ solution. The reaction mixture was heated to 125° C. under $N_2$ and the $AgNO_3$ solution was added at a constant rate over 25 minutes via a 12 gauge TEFLON® fluoropolymer syringe needle. The reaction was held at 125° C. for 60 minutes then allowed to cool to room temperature.

Figure 3:
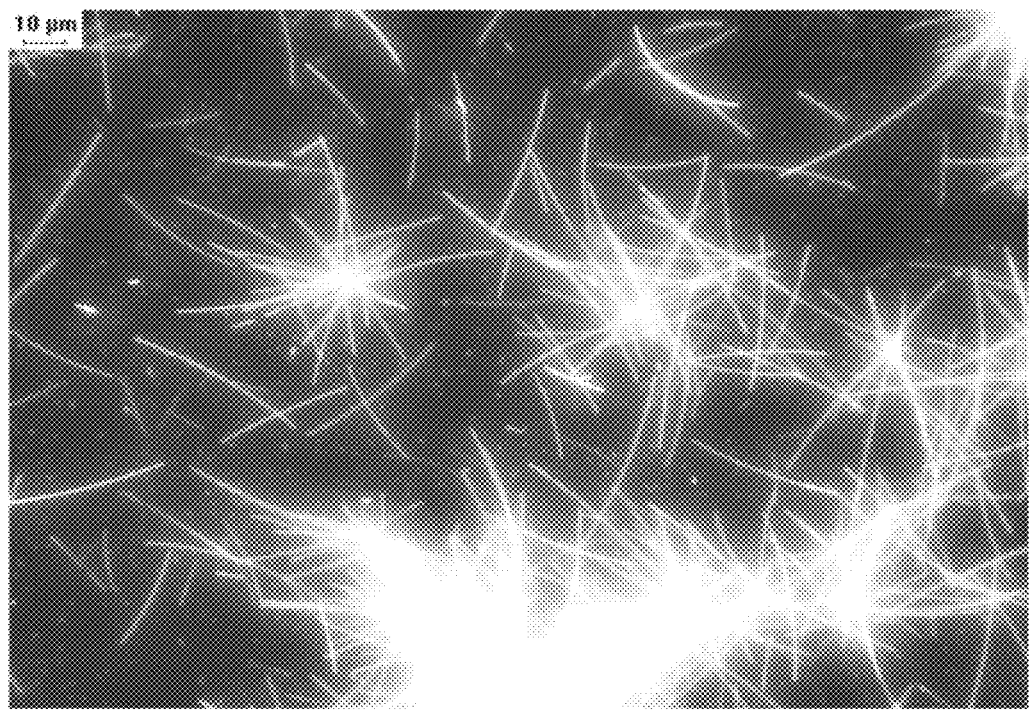
FIG. 3 shows an optical micrograph of the silver nanowire product of Example 3.

FIG. 3 shows an optical micrograph of the silver nanowire product. The nanowires had an average diameter of 80.4±25.3 nm and an average length of 28.8±12.4 μm, based on measurements of at least 100 wires.

Example 4

To a 500 mL reaction flask was added 300 mL ethylene glycol (EG), 2.2 g of PVP, and 1.0 g of a freshly prepared solution having a concentration of 5.6 mg phenyltintrichloride per gram of EG. This solution was degassed overnight by bubbling $N_2$ into the solution using a TEFLON® fluoropolymer tube at room temperature with mechanical stirring while at 100 rpm. A stock solution of 0.50 M $AgNO_3$ in EG was also degassed by bubbling $N_2$ into the solution for at least 60 minutes. A syringe was loaded with 20 mL of the $AgNO_3$ solution. The reaction mixture was heated to 145° C. under $N_2$ and the $AgNO_3$ solution was added at a constant rate over 25 minutes via a 12 gauge TEFLON® fluoropolymer syringe needle. The reaction was held at 145° C. for 60 minutes then allowed to cool to room temperature.

Figure 4:
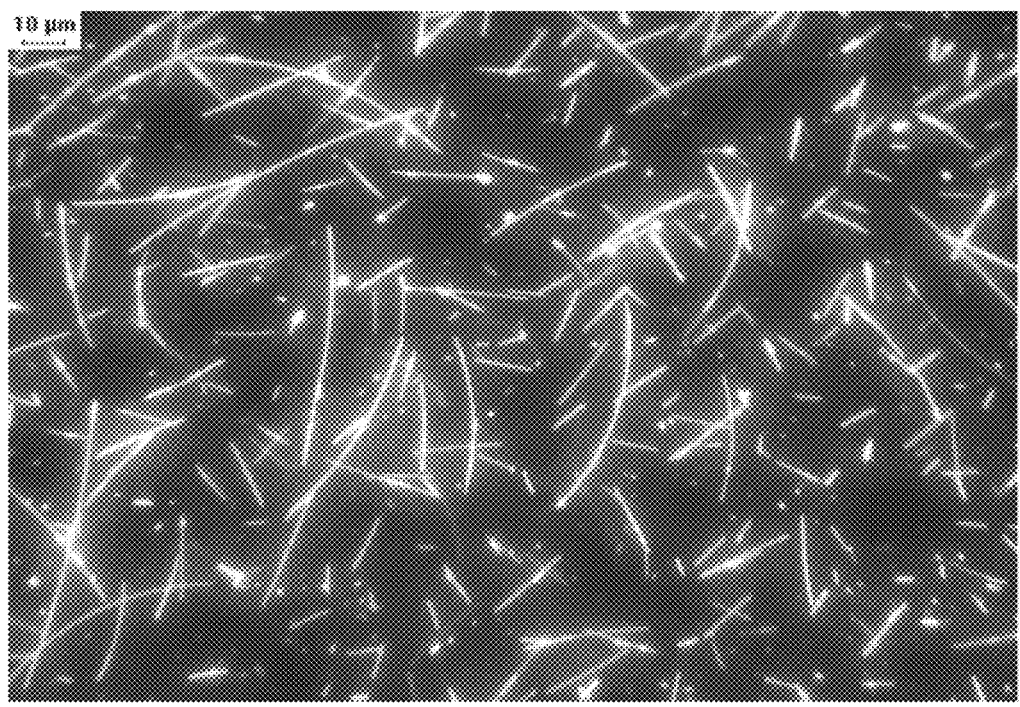
FIG. 4 shows an optical micrograph of the silver nanowire product of Example 4.

FIG. 4 shows an optical micrograph of the silver nanowire product. The nanowires had an average diameter of 185.7±72.8 nm and an average length of 8.1±6.6 μm, based on measurements of at least 100 wires.

Example 5 (Comparative)

To a 500 mL reaction flask was added 280 mL ethylene glycol (EG) and 1.4 g of a freshly prepared 15 mM $IrCl_3.3H_2O$ dispersion in EG. This solution was degassed for 2 hrs by bubbling $N_2$ into the solution using a glass pipette at room temperature with mechanical stirring while at 100 rpm. Stock solutions of 0.25 M $AgNO_3$ in EG and 0.84 M polyvinylpyrrolidinone (PVP) in EG were also degassed by bubbling $N_2$ into the solutions for at least 60 minutes. Two syringes were loaded with 20 mL each of the $AgNO_3$ and PVP solutions. The reaction mixture was heated to 155° C. under $N_2$ and the $AgNO_3$ and PVP solutions were added at a constant rate over 25 minutes via 12 gauge TEFLON® fluoropolymer syringe needles. The reaction was held at 155° C. for 90 minutes then allowed to cool to room temperature.

Figure 5:
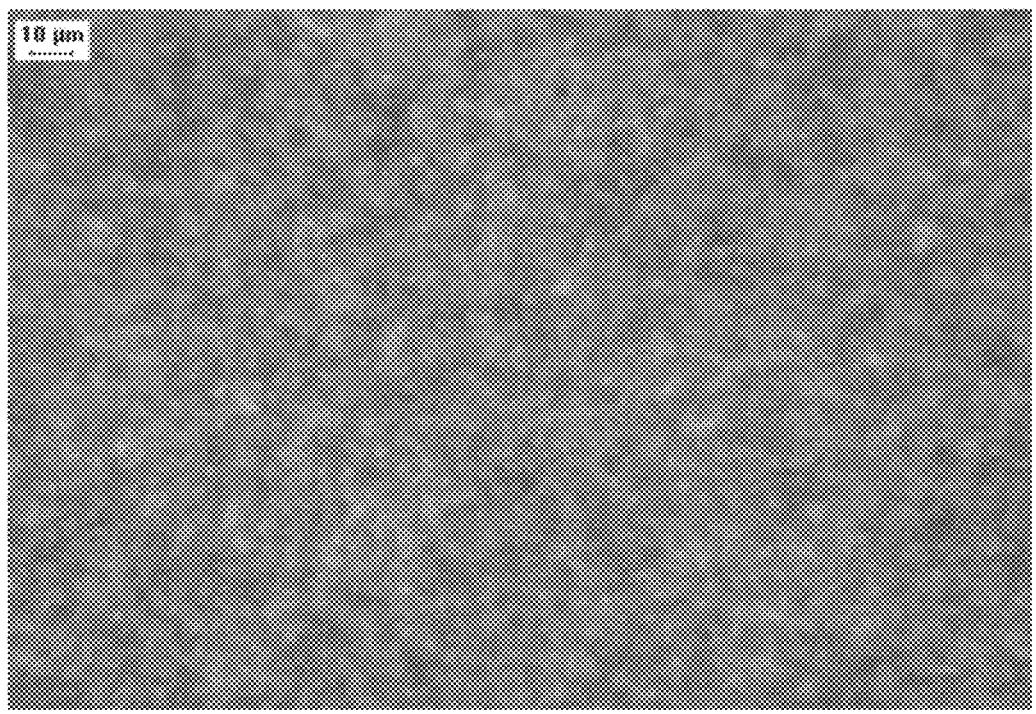
FIG. 5 shows an optical micrograph of the product of comparative Example 5.

FIG. 5 shows the reaction mixture after 60 min of reaction. Visible are nanoparticles, microparticles, with only a few short nanowires.

Example 6 (Comparative)

The procedure of Example 2 was repeated, using 2.9 g of a freshly prepared 7.0 mM dispersion of $K_2IrCl_6$ in EG, instead of the $IrCl_3.3H_2O$ dispersion. The reaction was carried out at 145° C., instead of 155° C.

Figure 6:
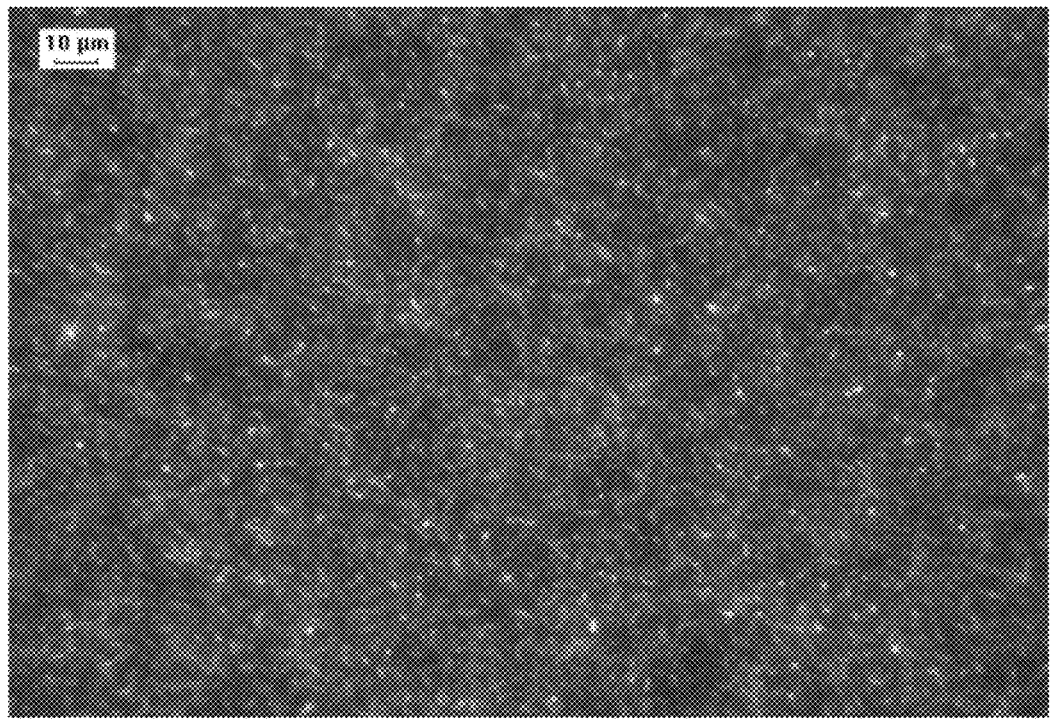
FIG. 6 shows an optical micrograph of the product of comparative Example 6.

FIG. 6 shows the reaction mixture after 90 min of reaction. Only a few fine nanowires are visible.

Example 7 (Comparative)

The procedure of Example 3 was repeated, using 2.3 g of a freshly prepared 7.0 mM dispersion of $InCl_3.4H_2O$ in EG, instead of the $IrCl_3.3H_2O$ dispersion.

Figure 7:
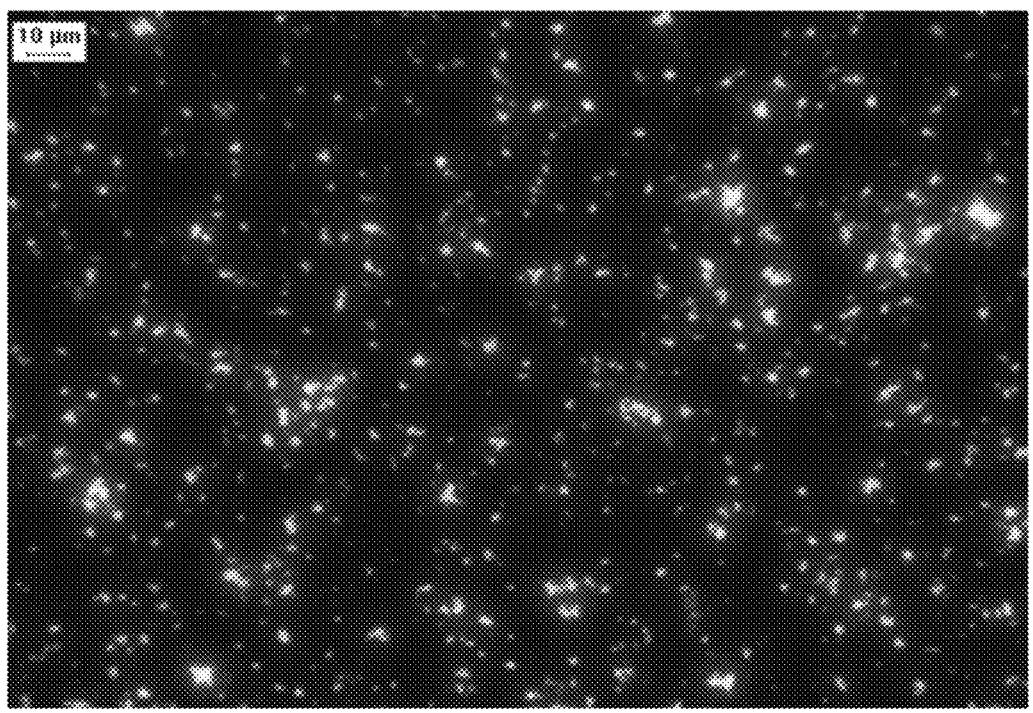
FIG. 7 shows an optical micrograph of the product of comparative Example 7.

FIG. 7 shows the reaction mixture after 90 min of reaction. No nanowires are visible.

Example 8 (Comparative)

To a 100 mL reaction flask was added 50 mL ethylene glycol (EG) and 0.29 g of 7.0 mM $AuCl_3$ in EG. This solution was degassed for 2 hrs by bubbling $N_2$ into the solution using a glass pipette at room temperature with mechanical stirring while at 100 rpm. Stock solutions of 0.25 M $AgNO_3$ in EG and 0.84 M polyvinylpyrrolidinone (PVP) in EG were also degassed by bubbling $N_2$ into the solutions for at least 60 minutes. Two syringes were loaded with 3 mL each of the $AgNO_3$ and PVP solutions. The reaction mixture was heated to 145° C. under $N_2$ and the $AgNO_3$ and PVP solutions were added at a constant rate over 25 minutes via 20 gauge TEFLON® fluoropolymer syringe needles. The reaction was held at 145° C. for 150 minutes then allowed to cool to room temperature.

Samples taken after 15, 30, 60, 90, 120, and 150 min of reaction appeared to have only nanoparticles, but no nanowires.

The invention has been described in detail with reference to particular embodiments, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced within.

What is claimed:

1. A method comprising:
   providing a composition comprising at least one first silver ion and at least one compound comprising at least one second metal and at least one carbon atom covalently bonded to the at least one second metal, the at least one second metal differing in atomic number from silver and comprising at least one element from the International Union of Pure and Applied Chemistry (IUPAC) Groups 4 or 14, the at least one compound further comprising at least one cyclopentadienyl moiety; and
   reducing the at least one first silver ion to at least one first silver nanowire, wherein the at least one silver nanowire has a length greater than 10 microns.

2. The method according to claim 1, wherein the at least one second metal comprises titanium or tin.

3. The method according to claim 1, wherein the at least one silver nanowire has a diameter less than 300 nm.

4. The method according to claim 1, wherein the reduction of the at least one silver ion to the at least one first silver nanowire occurs at one or more temperatures from about 80° C. to about 190° C.

5. The method according to claim 4, wherein the reduction occurs at one or more temperatures from about 120° C. to about 190° C.

6. A method comprising:
provide a composition comprising at least one first silver ion and at least one compound comprising titanocene dichloride; and
reducing the at least one first silver ion to at least one first silver nanowire, wherein the at least one silver nanowire has a length greater than 10 microns.

7. The method according to claim 6, wherein the at least one silver nanowire has a diameter less than 300 nm.

8. The method according to claim 6, wherein the reduction of the at least one silver ion to the at least one first silver nanowire occurs at one or more temperatures from about 80° C. to about 190° C.

9. The method according to claim 8, wherein the reduction occurs at one or more temperatures from about 120° C. to about 190° C.

\* \* \* \* \*

UNITED STATES PATENT AND TRADEMARK OFFICE
CERTIFICATE OF CORRECTION

PATENT NO. : 9,017,450 B2
APPLICATION NO. : 13/291308
DATED : April 28, 2015
INVENTOR(S) : David R. Whitcomb It is certified that error appears in the above-identified patent and that said Letters Patent is hereby corrected as shown below:

IN THE SPECIFICATION

Column 7, Line 53 — Please replace the word "$IrCl_3.3H_2O$" with the word -- $IrCl_3 \cdot 3H_2O$ --

Column 8, Line 5 — Please replace the word "$IrCl_3.3H_2O$" with the word -- $IrCl_3 \cdot 3H_2O$ --

Column 8, Line 14 — Please replace the word "$IrCl_3.3H_2O$" with the word -- $IrCl_3 \cdot 3H_2O$ --

Signed and Sealed this
Nineteenth Day of January, 2016

Michelle K. Lee
*Director of the United States Patent and Trademark Office*